(12) United States Patent
Loloee

(10) Patent No.: US 7,354,505 B2
(45) Date of Patent: Apr. 8, 2008

(54) EPITAXIAL FERROMAGNETIC $NI_3FEN$

(75) Inventor: Reza Loloee, Okemos, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 402 days.

(21) Appl. No.: 10/925,815

(22) Filed: Aug. 25, 2004

(65) Prior Publication Data

US 2006/0046101 A1    Mar. 2, 2006

(51) Int. Cl.
*C23C 14/35*    (2006.01)

(52) U.S. Cl. ............... 204/192.2; 204/192.12

(58) Field of Classification Search ........... 204/192.12, 204/192.2
See application file for complete search history.

(56) References Cited

U.S. PATENT DOCUMENTS

| | | |
|---|---|---|
| 5,264,981 A | 11/1993 | Campbell et al. |
| 5,871,622 A * | 2/1999 | Pinarbasi ............... 204/192.11 |
| 6,473,960 B1 | 11/2002 | Schwartz et al. |
| 6,495,311 B1 | 12/2002 | Khan et al. |
| 6,667,850 B2 | 12/2003 | Khan et al. |

OTHER PUBLICATIONS

Chiba et al. "Magnetic properties and microstructure of Ni-Fe nitride films by reactive sputtering", Journal of Magnetism and Magnetic Materials 242-245 (Apr. 2002) 949-951.*
Zheng, Y., et al., Appl. Phys. 85 4776 (1999).
Loloee, R., et al., Appl. Phys. Lett, 82 3281 (2003).
Panda, R.N., et al., J. Appl. Phys., 86 3295 (1999).
Li, F., et al., Appl. Phys. Lett., 66 2343 (1995).
Wang, H.Y., et al., J. Appl. Phys. 91 1453 (2002).
Loloee, R., et al, Philosophical Magazine 81 261-273 (2001).
Mohn et al, Physical Review B 45, No. 8 (1992).
JOM-e 52(6) 2000 and Caruso et al., Sensors Mag. (_).
Harper's Physics Series New York, NY p. 72 (1965).
P. Dubos et al., J. Vac. Sci. Techn. B 18, 122 (2000).

* cited by examiner

*Primary Examiner*—Rodney G. McDonald
(74) *Attorney, Agent, or Firm*—Ian C. McLeod

(57) ABSTRACT

An epitaxial $Ni_3FeN$ film with unique magnetic properties such as single magnetic domain (even in a large scale 0.5"×0.5"), which rotates coherently in response to the desired switching field with a very sharp transition is described. The magnetic hysteresis loop of this new magnetic nitride is close to the perfect ideal square with the same value of saturation magnetization, remnant magnetization, and magnetization right before switching (domain reversal). The switching field is tunable which make this material more attractive for magneto-resistive devices such as MRAM's, read heads and magnetic sensors.

4 Claims, 15 Drawing Sheets

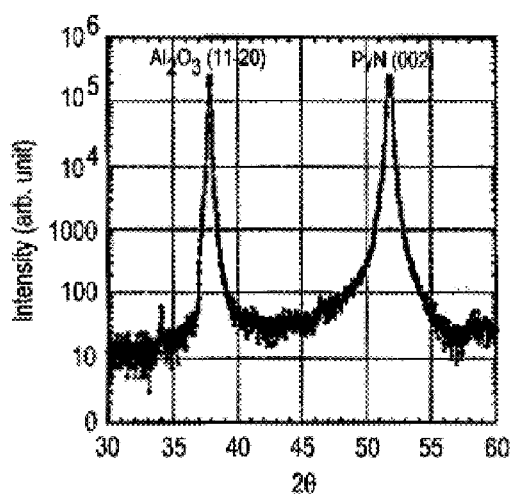
FIG. 1
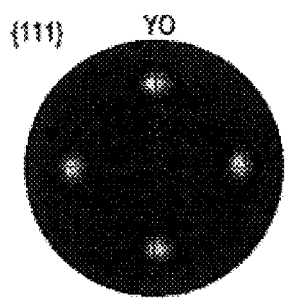 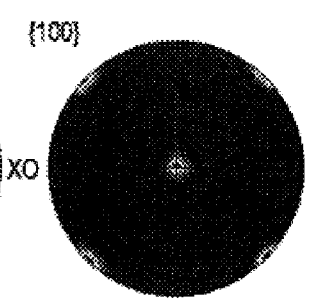 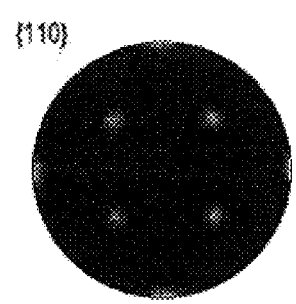
FIG. 2A  FIG. 2B  FIG. 2C

EPITAXIAL FERROMAGNETIC NI₃FEN

U.S. GOVERNMENT RIGHTS

This invention was developed under U.S. NSF Grant HMR 98-02476. The U.S. Government has certain rights to this invention.

CROSS REFERENCE TO RELATED APPLICATIONS

None

BACKGROUND OF THE INVENTION (1) Field of the Invention

The present invention relates to ferromagnetic $Ni_3FeN$ which is epitaxial. In particular the present invention relates to a process for preparing the epitaxial $Ni_3FeN$.

(2) Background of the Invention

The need for improvements in sensitivity, performance, and reduction in size of magnetoresistive devices, such as non-volatile magnetoresistive random access memory (MRAM) and magnetic sensors, is the driving force in searching for new magnetic materials. The magnetic switching characteristics of patterned ferromagnetic films used in nanostructure magnetoresistive devices such as MRAM and magnetic sensors are critical to the sensitivity and performance of these generations of magnetic devices (Zheng, Y., et al., Appl. Phys. 85 4776 (1999)). The homogeneity of magnetic domains, magnetic anisotropy and magnetic domain reversal speed (switching speed) are some of the critical factors in the sensitivity and performance of the mentioned devices.

In recent years, non-epitaxial Permalloy is one of the favored ferromagnetic materials that has been used in fabrication of read/write head, MRAM (magnetic tunnel junction (MTJ) structure), and other magnetic storage element and magnetic sensors. Non-epitaxial Permalloy (Py) is one of the particular types of the Fe—Ni alloy family, with a nickel concentration of 81%, ($Ni_{81}Fe_{19}$), and is an fcc derivative $L1_2$ structure "soft" ferromagnetic metal which is easily magnetized and demagnetized. The magnetic and transport properties of non-epitaxial Py thin films has been studied and used in different devices in great depth. One advantage of using non-epitaxial Py (with respect to other ferromagnets such as Co and Fe) in magnetic devices is its softness. Unfortunately, non-epitaxial Py thin films can have single-magnetic-domain state only for sub-micrometer in-plane dimensions of a certain shape.

It has been shown that by introducing nitrogen as an interstitial impurity into a ferromagnetic metal, which results in expansion of the host lattice, the magnetic, transport and structural properties of the host materials will change. In the past few decades, several investigators have studied numerous of magnetic materials such as 3d metallic and 3d-3f intermetallic compounds. Most of the reported works were focused on iron nitrides (Loloee, R., et al., Appl. Phys. Lett, 82 3281 (2003)), nitrodes of 3d-4f intermetallic compounds, and a few on Fe—Ni nitride systems (Panda, R. N., et al., J. Appl. Phys., 86 3295 (1999); Li, F., et al., Appl. Phys. Lett., 66 2343 (1995); and Wang, H. Y., et al., J. Appl. Phys. 91 1453 (2002)). See also Loloee, R., et al, Philosophical Magazine 81 261-273 (2001) and Mohn et al, Physical Review B 45, No. 8 (1992), all of which are incorporated by reference.

In general, insertion of interstitial nitrogen into the NiFe unit cell allows the structure of non-epitaxial $Ni_3FeN$ to remain cubic (fcc-like) with Ni atoms at fcc sites, Fe atoms at the corner of the unit cell and the interstitial nitrogen atom at body center. The structure and/or magnetic properties of $(Fe_{1-x}Ni_x)_4$ N compounds with various X between 0 and 0.6 and the nanocrystalline γ-Fe—Ni—N system (X 0.75) have been studied by several investigators (Panda, R. N., et al., J. Appl. Phys., 86 3295 (1999); Li, F., et al., Appl. Phys. Lett., 66 2343 (1995); and Wang, H. Y., et al., J. Appl. Phys. 91 1453 (2002)), all of which are incorporated by reference.

The state of the patent art in ferromagnetic devices is shown in U.S. Pat. No. 5,264,981 to Campbell et al., U.S. Pat. No. 6,473,960 to Schwartz et al., U.S. Pat. Nos. 6,495,311 and 6,667,850 to Khan et al., which are all incorporated by reference herein. Other references are JOM-e 52(6) 2000 and Caruso et al., Sensors Mag.

OBJECTS

It is therefore an object of the present invention to provide a new epitaxial ferromagnetic $Ni_3FeN$ material with unique properties. It is also an object of the present invention to provide a relatively inexpensive and useful process for producing the epitaxial $Ni_3FeN$. These and other objects will become apparent from the following description and the drawings.

SUMMARY OF THE INVENTION

The present invention relates to epitaxial $Ni_3FeN$ exhibiting magnetic anisotropy, a single magnetic domain, and an essentially a square transition movement upon switching of an external applied magnetic field direction providing a hysteresis loop.

The $Ni_3FeN$ is preferably grown on $Al_2O_3$ (1120). The $Ni_3FeN$ is also preferably grown on layers of Cu on Nb on $Al_2O_3$ (1120). The epitaxial $Ni_3FeN$ exhibits a sharp transition between magnetization states, and $\Delta H_{SW}$, is equal to about 0.025 Oe. The $Ni_3FeN$ can be on a substrate comprising $Al_2O_3$ (1120).

The present invention also relates to a process for the preparation of epitaxial $Ni_3FeN$, which comprises:

(a) providing a substrate which serves as a nucleation site for epitaxial growth of $Ni_3FeN$ in a reaction chamber;

(b) optionally providing a buffer layer which serves as a nucleation site for epitaxial growth of $Ni_3FeN$ in a reaction chamber; and (c) sputter depositing the $Ni_3FeN$ onto the substrate or buffer layer from a source of $Ni_{81}Fe_{19}$ in a nitrogen atmosphere in a chamber at a reduced pressure and an elevated temperature to produce the $Ni_3FeN$.

The substrate for the depositing is preferably directly on $Al_2O_3$ (1120). The substrate for depositing is also preferably Cu on Nb as a buffering layer on $Al_2O_3$ (1120). The sputtering takes place at a nitrogen partial pressure between 30-40% of total Argon pressure and at a temperature of about 400° C. or higher.

The present invention also relates to a device comprising epitaxial $Ni_3FeN$ exhibiting magnetic anisotropy, a single magnetic domain, and an essentially square transition movement upon switching of an external applied magnetic field direction providing a hysteresis loop.

The device can be a magnetorestrictive film. The device can also be a magnetorestrictive Random Access Memory (MRAM). The device can also be magnetorestrictive and senses magnetic fields.

The present invention also relates to a method for detecting a magnetic field, which comprises:

(a) providing a device comprising epitaxial $Ni_3FeN$ exhibiting magnetic anisotropy, a single magnetic domain, and an essentially square transition movement upon switching of an external applied magnetic field direction providing a hysteresis loop; and (b) exposing the device to a magnetic field so as to detect the magnetic field.

The present invention also relates to a method of inducing a magnetic field which comprises:

(a) providing a device comprising epitaxial $Ni_3FeN$ exhibiting magnetic anisotropy, a single magnetic domain, and an essentially a square transition movement upon switching of an external applied magnetic field direction providing a hysteresis loop; and (b) exposing the device at an electrical current to induce a magnetic field in the device. The electrical current direction is switched to reverse the magnetic field.

BRIEF DESCRIPTION OF DRAWINGS

FIG. 1 is a graph showing a high angle x-ray diffraction spectra of $Al_2O_3$ (1120)/PyN(100) film. The film is 200-nm-thick.

FIGS. 2A, 2B and 2C are (111), (100), and (110) Pole figures of an epitaxial 200-nm-thick PyN films deposited on $Al_2O_3$ (1120) substrates.

DESCRIPTION OF PREFERRED EMBODIMENTS

Figure 3:
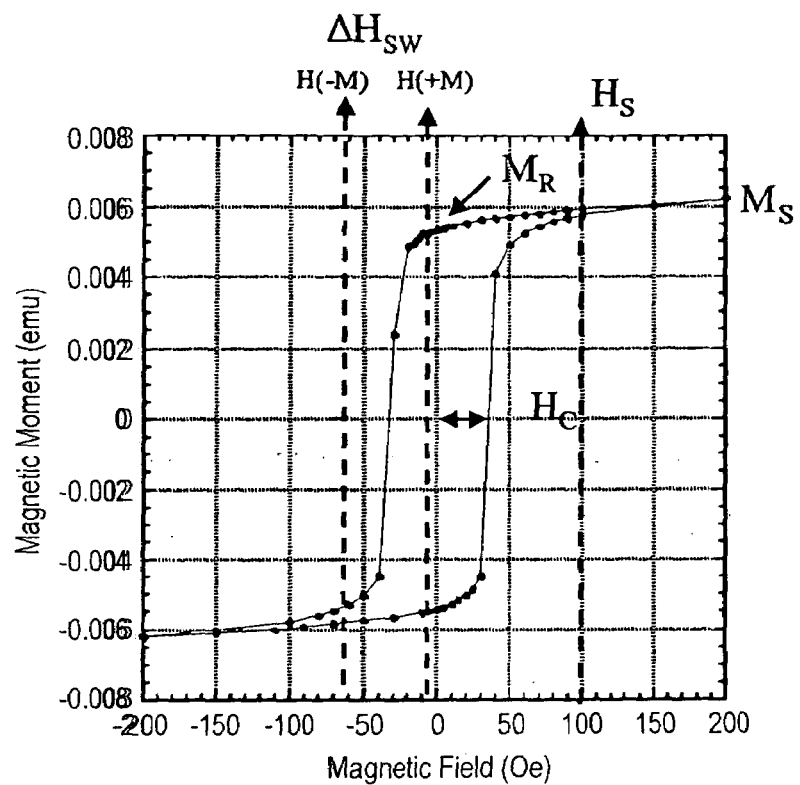
FIG. 3 is a graph of a typical magnetization hysteresis loop of a non-epitaxial ferromagnet of the prior art.

The novel ferromagnetic epitaxial nitride ($Ni_{80}Fe_{16}N$=Permalloy Nitride="PyN") compound where 80 and 16 are percentages by weight, was grown in the form of epitaxial films on different substrates using reactive triode magnetron sputtering. The effects of orientations and type of substrate, nitrogen composition, growth temperature, buffer layer, and film thickness on magnetic, and structural properties of deposited PyN films are disclosed. Electron backscattering diffraction (EBSD) and x-ray diffraction (XRD) techniques were used for structural characterization, and a superconducting quantum interference device SQUID magnetometer was used to provide the magnetic properties of the deposited films. The magnetization measurements of samples deposited on one type of substrate, with and without buffer layers, revealed unique results, such as the existence of single magnetic domain, which rotate coherently in response to the desired switching field, and reversed with a sharp transition. The magnetic properties of the new magnetic nitride films (PyN) are compared with those of Py films.

Having a magnetic material with lower coercivity (softer) and single magnetic domain regardless of its size and shape, which rotates suddenly and coherently in response to desired switching field is a significant advantage for some of magnetoresistive devices (e.g. MRAM and read head).

Thus the present invention particularly relates to the growth and characterization of a new generation of high quality epitaxial PyN films on $Al_2O_3$(0001), $Al_2O_3$ (1120), MgO(001), Mgo(111), and Si substrates using a dc triode magnetron sputtering system in a reactive $N_2$ gas. X-ray diffraction and electron backscatter diffraction (EBSD) patterns were used to characterize the growth normal direction and in-plane orientation distributions of the epitaxial films.

A Superconducting Quantum Interference Device (SQUID) magnetometer was used to measure the magnetization (M) vs. magnetic field (H) including the saturation magnetization ($M_S$), remnant magnetization ($M_R$) coercive field ($H_C$), and switching field gradients ($\Delta H_{SW}$=H(+M)−H (−M), correspond to coulomb interaction energy of the system J)(Soohoo, R. F., Magnetic Thin Films (Harper's Physics Series New York, N.Y. p. 72 (1965)) in the PyN films (see FIG. 3). Prior to deposition, the substrates were pre-deposition annealed at about 1200° C. The substrate temperature during the deposition was kept in the range of 400° C. or higher. Deposition of all nitride films was performed in mixtures of $2.0 \times 10^{-3}$ Torr of Ar and $0.2$-$1.2 \times 10^{-3}$ Torr of $N_2$ gas, with a chamber base pressure of $2.0 \times 10^{-8}$ Torr. The details of the experimental setup and the growth procedure have been described elsewhere which is incorporated herein by reference (Loloee, R., et al., *Phil. Mag A* 81, 261 (2001)). EBSD patterns from the substrates and the permalloy nitride films were obtained in a Cam Scan 44FE scanning electron microscope operating at 25 kV. The collected data were displayed in form of pole figures (using the Channel 5™ software package (Channel 4 orientation-mapping manual; HKL Technology (1997)), which was determined from indexed Kikuchi bands and recorded by a Cam Scan ORTEX CCD. A MPMS Quantum Design magnetometer was used to carry out the magnetization measurements.

The choice of proper substrate was the first critical step toward producing high quality epitaxial nitride films. The structure, lattice parameter, and normal orientation of the substrate have a direct effect on the nucleation, the growth normal, the in-plane orientation, and the structural quality of the deposited nitride films. Therefore, the first series of nitride films, 200 nm-thick epitaxial PyN films (at 36% $N_2$) were deposited on $Al_2O_3$(0001), $Al_2O_3$ (11$\bar{2}$0), MgO(001), MgO(111), substrates. $Al_2O_3$ has a hexagonal structure with a lattice parameter of a=4.76 Å, MgO has a cubic structure with a lattice parameter of a=4.21 Å, and the structure of $Ni_3FeN$ is similarly cubic (fcc-like) with a lattice parameter of a=3.52 Å (Wang, H. Y., et al., *J. Appl. Phys.* 91 1453 (2002)). This gives large lattice mismatches which will induce strain in the nitride films and could affect the growth normals, the in-plane orientation relationship with respect to the substrate between the nitride films and the magnetic properties. The EBSD patterns obtained from a few sets of 200-nm-thick epitaxial PyN films deposited on $Al_2O_3$ (11$\bar{2}$0) and MgO(001) were very sharp, while some pattern degradation was noted for the sample grown on MgO(111) and severe degradation was seen for the sample grown on $Al_2O_3$(0001). From crystallographic point of view, EBSD results revealed that the $Al_2O_3$ (11$\bar{2}$0) and MgO(001) substrates are better candidates for growth of high quality epitaxial PyN films. The resulting pole figures revealed that the growth direction of PyN on the $Al_2O_3$ (11$\bar{2}$0) and MgO(001) substrate was [001]. Pole figures collected from entire films displayed the same orientation, which indicates that the PyN films are high quality epitaxial films. The epitaxial relationship between PyN and $Al_2O_3$ and MgO were:

(001)PyN∥(11$\bar{2}$0)$Al_2O_3$ with [100]PyN∥[1$\bar{1}$00]$Al_2O_3$, (001) PyN∥(001)MgO with [100]PyN∥[100]MgO, The (111), (100), (110) Pole figures of an epitaxial 200-nm-thick PyN films deposited on $Al_2O_3$ (11$\bar{2}$0) substrates are shown in FIGS. 2A, 2B and 2C, respectively.

To ensure that no other nitride phases have grown on PyN, x-ray diffraction (XRD) experiments were performed on all samples. The results revealed only the existence of one phase, epitaxial $Ni_3FeN$ and are shown in FIG. 1.

The coercivity of the epitaxial PyN films was determined by measuring the in-plane magnetization of PyN films. All of the magnetization measurements are shown here and were carried out at room temperature (300K). The magnetization hysteresis loops of four sputter deposited epitaxial PyN films on different substrates are measured. The coercive field, $H_C$ and switching field gradient $\Delta H_{SW}$ of the PyN and an epitaxial Py films were tabulated in Table 1.

TABLE 1

| Substrate/PyN | $H_c$(Oe) | $\Delta H_{sw}$(Oe) |
|---|---|---|
| $Al_2O_3$(0001)/200 nm PyN | 37 | 10 |
| $Al_2O_3$(11$\bar{2}$0)/200 nm PyN | 0.5 | 0.5 |
| MgO(100)/200 nm PyN | 9 | 7 |
| MgO (111)/200 nm PyN | 20 | 10 |
| $Al_2O_3$(0001)/200 nm Py | 25 | 25 |

The difference between coercive field values of individual samples is most likely related to the degree of crystalline quality and the amount of strain in the epitaxial PyN films due to different lattice mismatch, nucleation process, and defects. The tabulated results in Table 1 suggest that only $Al_2O_3$ (11$\bar{2}$0) substrate is the ideal candidate for growing the epitaxial PyN films.

Figure 4:
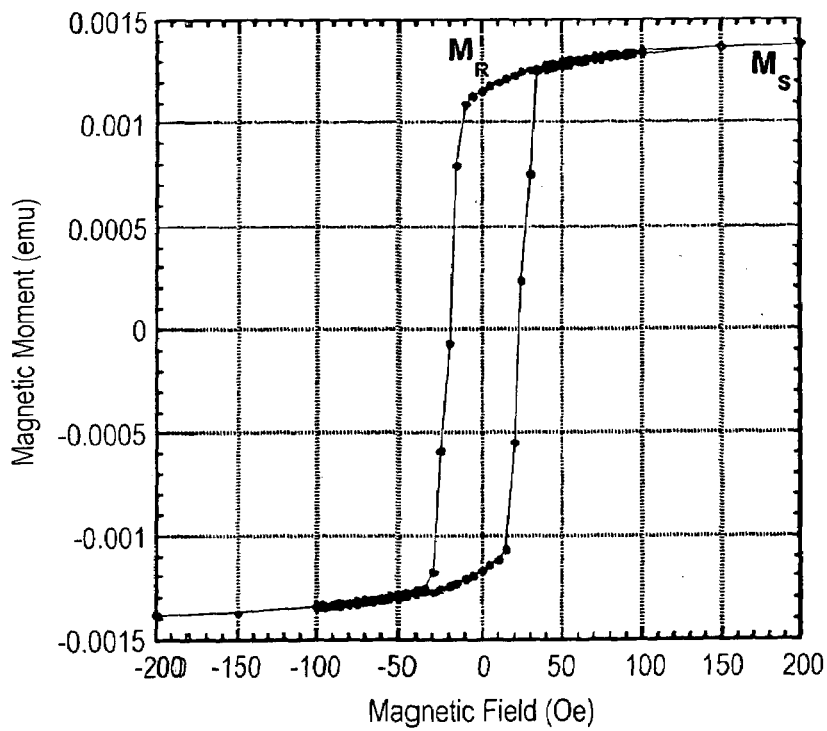
FIG. 4 is a graph showing magnetization hysteresis loops of 200 nm thick of an epitaxial Py film deposited on $Al_2O_3$ (1120) substrates.
Figure 5:
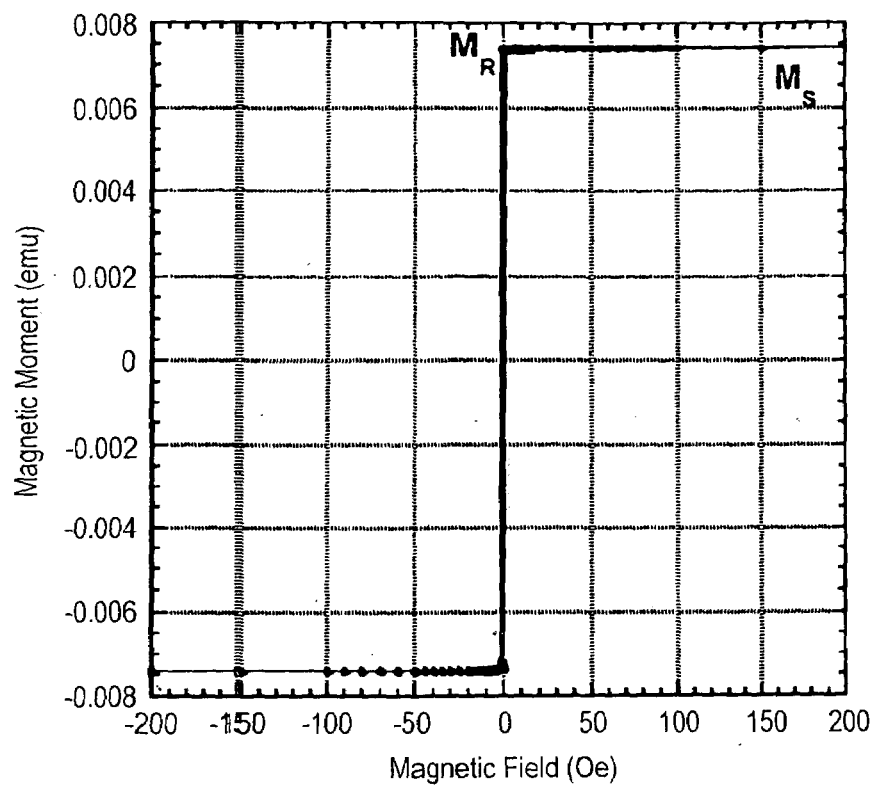
FIG. 5 is a graph showing magnetization hysteresis loops of 200 nm thick of an epitaxial PyN film deposited on $Al_2O_3$ (1120) substrates.
Figure 6:
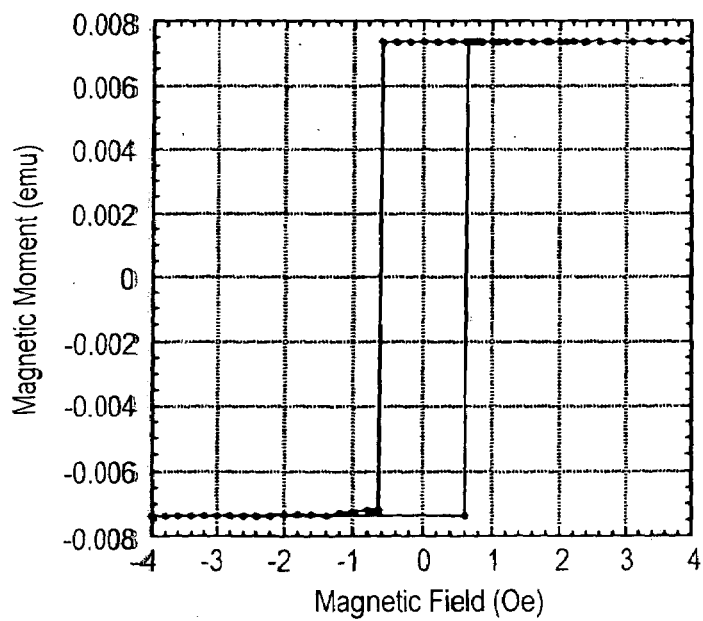
FIG. 6 is a graph showing the expanded loop of FIG. 5 with $\Delta H_{SW}$=0.025 Oe.
Figure 7:
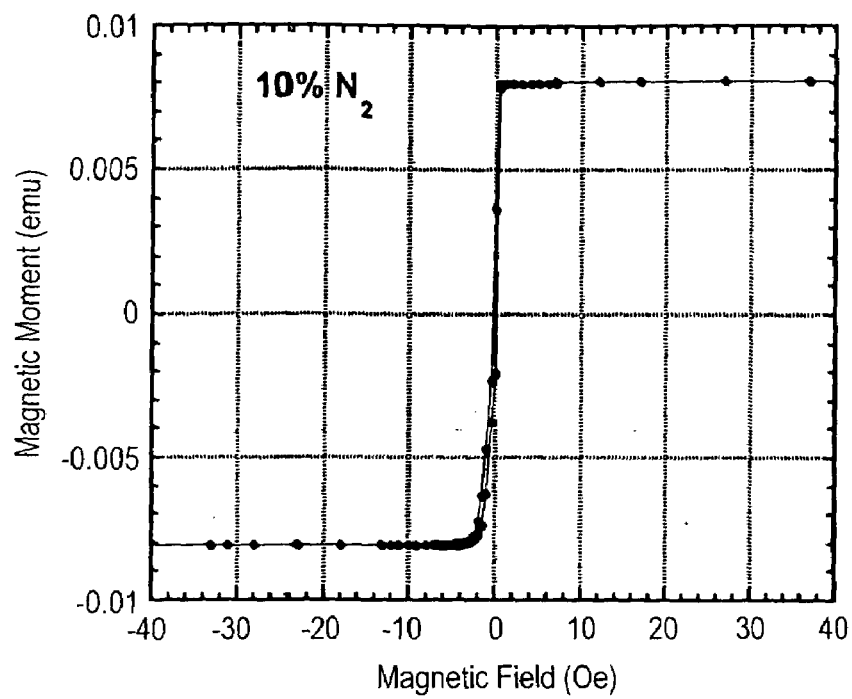
FIGS. 7, 8 and 9 are graphs showing magnetization hysteresis loops of 200 nm thick of epitaxial PyN film deposited on $Al_2O_3$ (1120) substrates with 10, 30, and 60% $N_2$ in Ar compositions, respectively.
Figure 8:
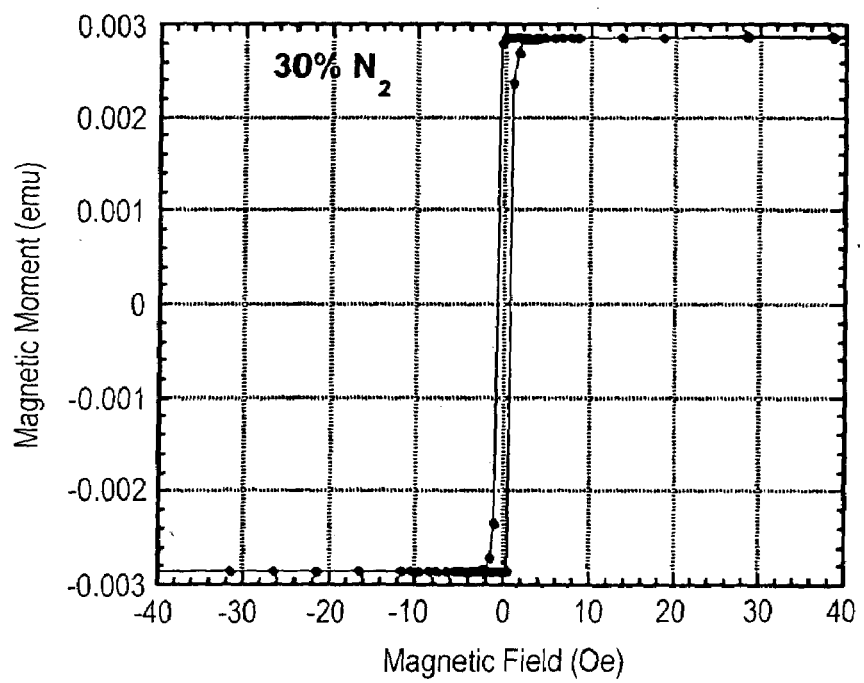
Figure 9:
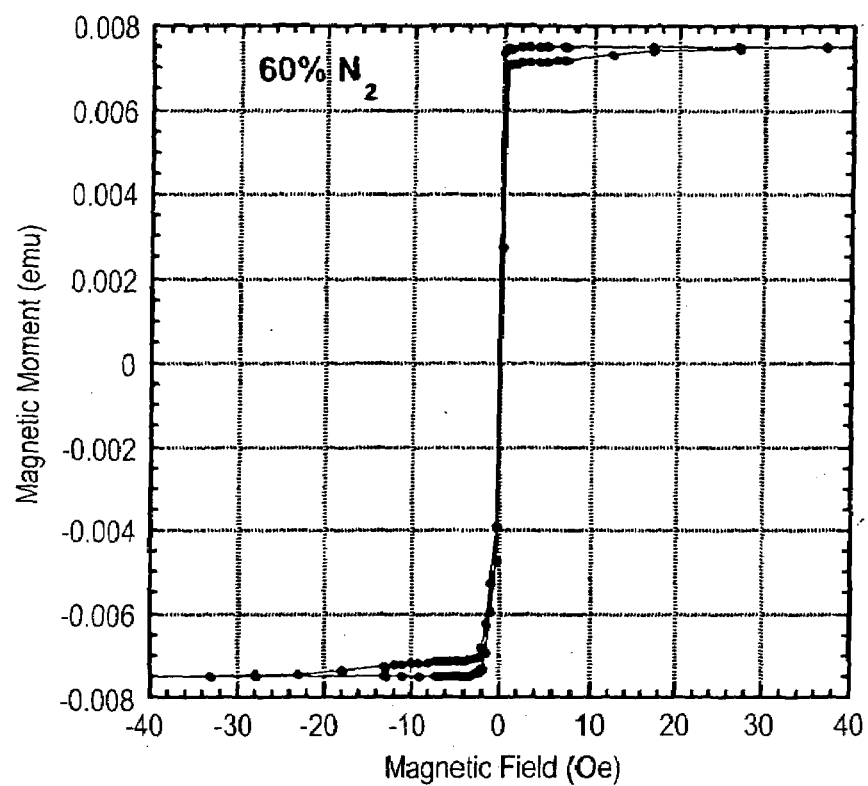
Figure 10:
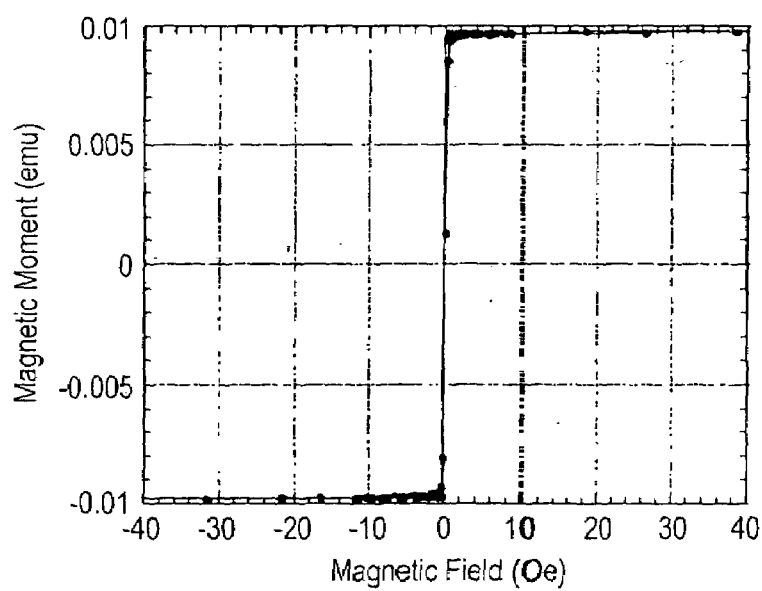
FIGS. 10 and 11 are graphs showing variation of the hysteresis loop of epitaxial PyN films at 300K for 200 and 20 nm thick, respectively. The value of coercivity $H_c$ are 0.25 & 13 and $\Delta H_{SW}$=0.1 Oe.
Figure 11:
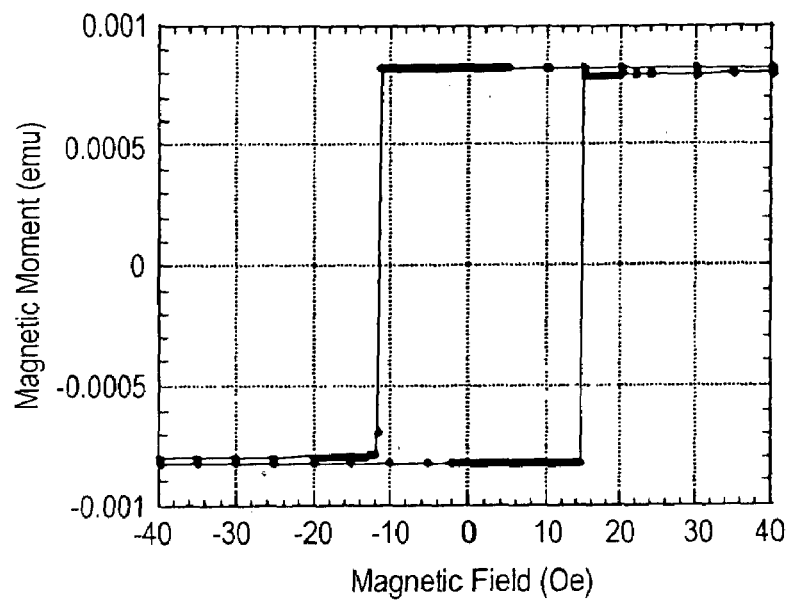

For comparison between the new magnetic epitaxial PyN and the existing commonly used magnetic non-epitaxial Py, the hysteresis loops of a 200 nm thick epitaxial Py film and an epitaxial PyN film are shown in FIGS. 4 and 5, respectively. The difference between these two loops indicates that the epitaxial PyN has a single magnetic domain, with a very sharp transition (see FIG. 6) compared to Py, which has multi-domains (Notice the difference between $M_S$ and $M_R$ as well as curvatures around switching field in FIG. 4). The affect of different $N_2$ concentrations on the PyN films by depositing a set of samples in a similar manner as the previous sets were studied, but with varying $N_2$ concentration from 10% to 60%. Magnetization hysteresis loops of 200 nm thick of epitaxial PyN film deposited on $Al_2O_3$ (11$\bar{2}$0) substrates with 10, 30, and 60% $N_2$ compositions are shown in FIGS. 7, 8 and 9, respectively. The $H_C$ and $\Delta H_{SW}$ parameters determined from the hysteresis loop revealed that the best nitride film with lowest $H_C$ and $\Delta H_{SW}$ was grown at %36 of $N_2$ gas composition. The saturation magnetizations ($M_S$) of 200-nm-thick PyN films were about 700-990 emu/cm³). Next the effect of thickness on the magnetic properties of the nitride films was studied. This set of samples included relevant PyN films ranging from 10 to 300-nm-thick with some being capped with 5 nm of Au. In FIGS. 10 and 11, the results two extreme with Au caps (20 and 200 nm) are shown. Remarkably, regardless of film thickness, the value of saturation magnetization ($M_S$), remnant magnetization ($M_R$), and value of magnetization right before sudden transition in each nitride film was equal with $\Delta H_{SW}$=0.025-0.5 Oe. This unique behavior of magnetization hysteresis loops suggested that there is a very homogeneous (single) magnetic domain in these epitaxial PyN films (even in a large scale 0.5"×0.5", unlike in Py which can have single domain only in sub-micrometer structures), which rotate coherently in response to the desired switching field and with a very sudden and sharp transition. This result also revealed that the high value of the $H_C$ in the thin film was not due to existence of multi-domains, but it was caused by induced lattice mismatched strain. Note that some of these samples have been measured frequently and repeatedly over eleven months and all the results were reproducible and no oxidization or formation of a top ferrohydrite layer was observed.

Figure 13:
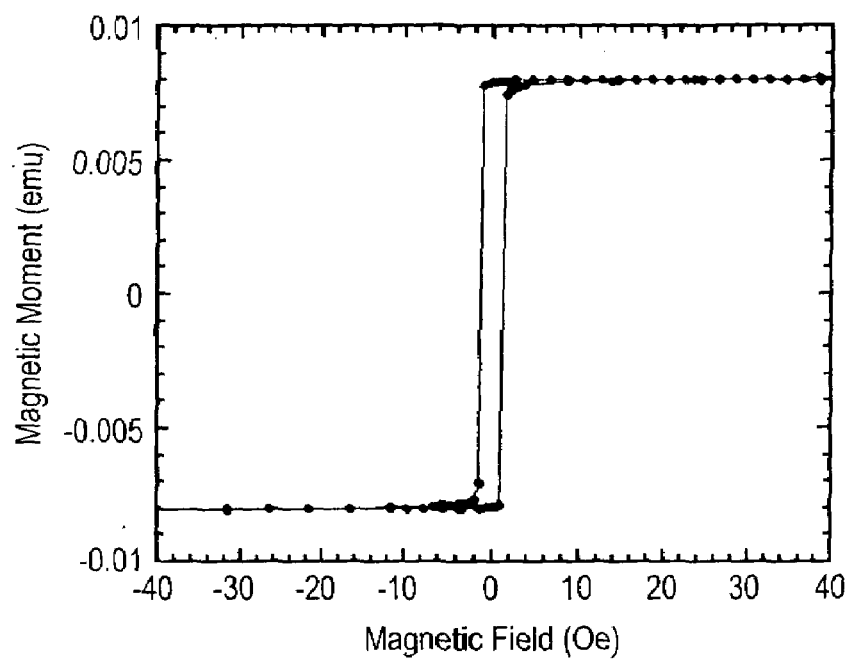
FIG. 13 is a graph showing magnetization hysteresis loops of 200 nm thick of an epitaxial PyN (111) film deposited on $Al_2O_3$ (1120)–200 nm Nb(110)–20 nm Cu(111) buffer layer.

In the next part of this invention, a buffer layer of Cu was used on substrates, $Al_2O_3$ (11$\bar{2}$0). To grow a good epitaxial Cu layer on $Al_2O_3$ (11$\bar{2}$0), a Nb buffer layer is needed (Soohoo, R. F., Magnetic Thin Films (Harper's physics Series New York, N.Y. p. 72 (1965)). A multilayer of epitaxial Nb(100 nm)-Cu(20 nm)-PyN(200 nm) was grown on Al$_2$O$_3$ (1120) substrate in a similar growth condition as previous samples. The EBSD and XRD results revealed that all layers were epitaxial and the growth normal was Nb(110)-Cu(111)-PyN(111). The magnetization hysteresis loops were similar to those of PyN (100) on the Al$_2$O$_3$ (1120) substrate with similar magnetic properties as shown in FIG. 13.

Thus a new ferromagnetic nitride "permalloy nitride epitaxial (PyN)" film was grown with unique magnetic properties such as single magnetic domain (even in a large scale 0.5"×0.5"), which rotates coherently in response to the desired switching field sudden and with sharp transition ($\Delta H_{SW} \approx 0.025$ Oe). The magnetic hysteresis loop of this new magnetic nitride is close to the perfect ideal square with the same value of saturation magnetization, remnant magnetization, and magnetization right before switching (domain reversal). The switching field is tunable which make this material more attractive for magneto-resistive devices.

EXAMPLE 1

The epitaxial Ni$_3$FeN films were grown onto Al$_2$O$_3$ (1120) substrates using a dc triode magnetron sputtering system in reactive N$_2$ gas as a reactive gas. The sputter deposition system contains two individual substrate heater assemblies. Prior to deposition, the Al$_2$O$_3$ (1120) substrates were pre-deposition annealed at about 1200° C. using the high temperature heater (ranging from 700° C. to 1200° C.). The pre-deposition annealing was optional and does not affect the growth process. Next, the low temperature heater (ranging from ~20° C. to ~700° C.) was used during the deposition to keep the substrate temperature at about 400° C. or higher. For the Nb/Cu/PyN multilayer, 100-200 nm thick Nb films were first deposited onto Al$_2$O$_3$ (1120) substrates and then 20-nm-thick Cu films were deposited. For single films of the epitaxial Ni$_3$FeN, 10 to 300-nm-thick Ni$_3$FeN films were deposited directly onto Al$_2$O$_3$ (1120) substrates from a Ni$_{81}$Fe$_{19}$ target (Angstrom Sensors, Duquesne, Pa. and Kurt J. Lesker, Co., Vacuum Product Co., Clairton, Pa.). Deposition of all nitride films was performed in mixtures of 2.0×10$^{-3}$ Torr of Ar and 0.2-1.2×10$^{-3}$ Torr of N$_2$ gas, with a chamber base pressure of 2.0×10$^{-8}$ Torr.

Characterization Tools:

Electron Backscatter diffraction (EBSD) patterns from the Al$_2$O$_3$ (1120) substrate and the nitride films were obtained in a Cam Scan 44FE scanning electron microscope operating at 25 kV. The collected data were displayed in form of pole figures, which was determined from indexed Kikuchi bands and recorded by a Cam Scan ORTEX CCD.

A MPMS Quantum Design magnetometer was used to carry out the magnetization measurements. The magnetic anisotropy of the epitaxial Ni$_3$FeN films and bilayers was studied by measuring the in-plane magnetization of these films in 0-200 Oe fields as the sample was rotated from 0° to 360° in 5-degrees steps.

Summary of the Results

Crystallographic Characterizations:

X-ray:

Referring to FIG. 1; to ensure that no other nitride phases have grown on Ni$_3$FeN, x-ray diffraction (XRD) experiments were performed on all samples. The results revealed only the existence of one phase Ni$_3$FeN. The composition is shown in Table 2.

TABLE 2

| Element | Wt % | At % |
| --- | --- | --- |
| N | 6.50 | 22.43 |
| Fe | 14.01 | 12.13 |
| Ni | 79.49 | 65.45 |
| TOTAL | 100.00 | 100.00 |

EBSD:

The EBSD patterns obtained from a few sets of 200-nm-thick Ni$_3$FeN films deposited on Al$_2$O$_3$ (1120) were sharp. With reference to FIG. 2, the resulting pole figures from EBSD data revealed that the growth direction of Ni$_3$FeN on the Al$_2$O$_3$ (1120) substrate was [001], while those grown on Cu were [111] (not shown). Pole figures collected from entire films displayed the same orientation, which indicates that the Ni$_3$FeN films are high quality epitaxial films. The epitaxial relationship between Ni$_3$FeN and Al$_2$O$_3$ and Cu were:

(001)PyN||(1120)Al$_2$O$_3$ with [100] PyN||[1100]Al$_2$O$_3$,
(111) PyN||(111)Cu with [110] PyN||[110]Cu.

Magnetization:

Referring to FIG. 3 as an example of a typical hysteresis loop of a ferromagnet, the coercivity (H$_C$), saturation magnetization (M$_S$), remnant magnetization (M$_R$), saturation field (H$_S$) and field required for reversing the state of magnetization (switching field gradients $\Delta H_{SW}$=H(+M)–H(–M)) is shown. All of the magnetization measurements are shown here was carried out at room temperature (300K). FIGS. 4 and 5, show comparison between the hysteresis loops of 200 nm thick of an epitaxial Py film (Py is an existing common used magnetic material) and an epitaxial Ni$_3$FeN film of the present invention. The difference between these two loops indicates that the Ni$_3$FeN has a single magnetic domain, with a very sharp transition compared to Py, which has multi-domains. The expanded hysteresis loop of FIG. 5 is shown in FIG. 6 with $\Delta H_{SW}$=0.025 Oe.

The affect of different N$_2$ concentrations on the Ni$_3$FeN films was investigated by depositing a set of samples in a similar manner as the previous sets, varying N$_2$ concentration from 10% to 60%. The hysteresis loop of films deposited at 10, 30, and 60% N$_2$ composition are shown in FIGS. 7, 8 and 9. The H$_C$ and $\Delta H_{SW}$ parameters determined from the hysteresis loop revealed that the best nitride film with lowest H$_C$ and $\Delta H_{SW}$ was grown at 36% by volume of N$_2$ gas composition. The saturation magnetizations (M$_S$) of 200-nm-thick Ni$_3$FeN films were about 700-990 emu/cm$^3$, similar to Py (750-800 emu/cm$^3$).

Figure 12:
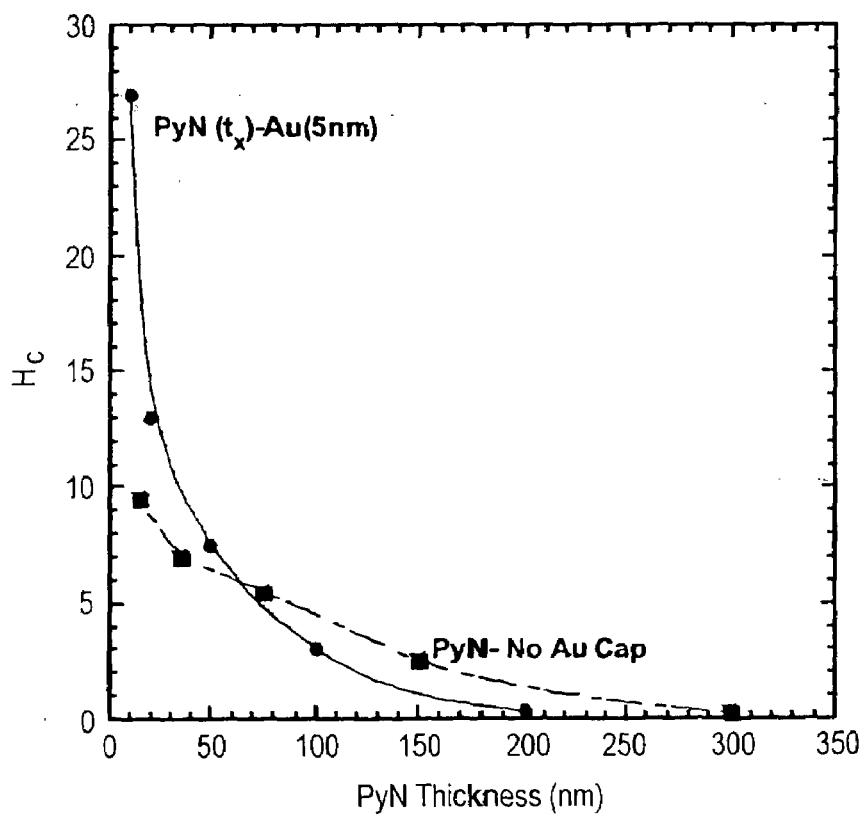
FIG. 12 is a graph showing variation of coercive field of two sets of PyN and PyN-Au films as a function of film thickness. Coercive field values collected from magnetization hysteresis loops of epitaxial PyN films, when measured at 300K.

The effect of thickness on the magnetic properties of the nitride films was studied. A set of samples included eleven epitaxial PyN films ranging from 10 to 300-nm-thick with some being caped with 5 nm of Au was deposited directly on Al$_2$O$_3$ (1120) substrates. In FIGS. 10 and 11, the magnetization hysteresis loops of two Ni$_3$FeN films (20 and 200 nm) with Au caps are shown. Remarkably, regardless of film thickness, the value of saturation magnetization (M$_S$), remnant magnetization (M$_R$) and value of magnetization right before sudden transition in each nitride film was equal, with $\Delta H_{SW}$=0.025–0.5 Oe. This unique behavior of magnetization hysteresis loops suggested that there is a very homogeneous (single) magnetic domain in these Ni$_3$FeN films (even in a large scale 0.5"×0.5", unlike in Py which can have single domain only in sub-micrometer structures), which rotate coherently in response to the desired switching field and with a very sudden and sharp transition. This result also revealed that the high value of the $H_C$ in the thin film was not due to existence of multi-domains, but it was caused by induced lattice mismatched strain. In FIG. 12, the variation of the coercivity of epitaxial $Ni_3FeN$ films as a function of film thickness is shown.

The epitaxial $Ni_3FeN$ can be grown on Cu buffer layer and the growth normal of buffer layer will define the growth normal of deposited $Ni_3FeN$. To grow a good epitaxial Cu layer on $Al_2O_3$ (1120), a Nb buffer layer is needed. A multilayer of epitaxial Nb(100 nm)-Cu(20 nm)-PyN(200 nm) was grown on $Al_2O_3$ (1120) substrate in a similar growth condition as previous samples. The EBSD and XRD results revealed that all layers were epitaxial and the growth normal was Nb(110)-Cu(111)-PyN(111). Referring to FIG. 13, the magnetization hysteresis loops were similar to those of PyN (100) on the $Al_2O_3$ (1120) substrate with similar magnetic properties.

Figure 14:
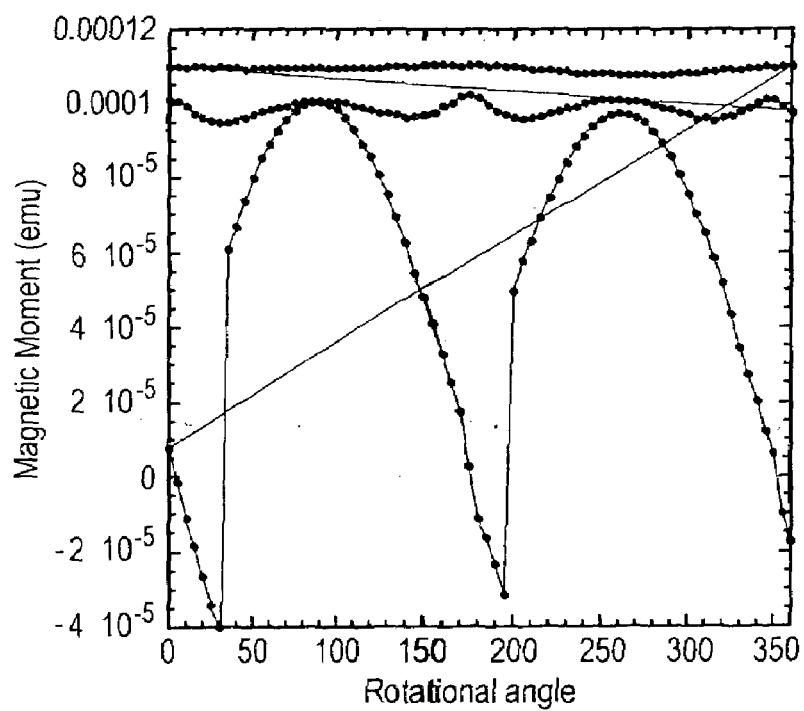
FIG. 14 is a graph showing an in-plane angular dependence of magnetization of 5, 50, and 200 Oe applied magnetic field for epitaxial 200-nm-thick PyN (100) films deposited directly on $Al_2O_3$ (1120) substrates. The maxima in the magnetic moment occur at 180° intervals indicating the preferred easy axes.
Figure 15A:
FIG. 15 is cross-sectional views of process for making Au electrical leads using the photolithography technique.
Figure 15B:
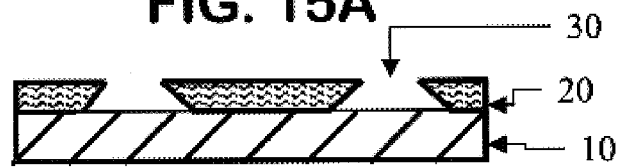

In-plane magnetic anisotropy and the directions of the easy axis in $Ni_3FeN$ films were investigated by measuring the rotational magnetization of each film. First, the magnetization direction of each sample was determined by performing an in-plane angular rotation from 0° to 360° in zero magnetic field. At H>0, the data display a period of 180°. At H=5 Oe in FIG. 14, the data have maxima only when H is along the easy axis. At larger H (50 Oe), a secondary sharp peak appears when H is perpendicular to the easy axis. The onset of secondary peaks in the angular in-plane dependence of magnetization can provides a direct measure of the uniaxial anisotropy strength.

Thus a new epitaxial ferromagnetic nitride "permalloy nitride (PyN)" film has been grown with unique magnetic properties such as single magnetic domain (even in a large scale 0.5"×0.5"), which rotates coherently in response to the desired switching field sudden and with sharp transition ($\Delta H_{SW} \approx 0.025$ Oe). The magnetic hysteresis loop of this new magnetic nitride is close to the perfect ideal square with the same value of saturation magnetization, remnant magnetization, and magnetization right before switching (domain reversal). The switching field is tunable which makes this material more attractive for magneto-resistive devices.

The following is a description of the photolithography and e-beam-lithography processes used for fabricating a small (nano-size) polycrystalline magnetic multilayer and the expected $Ni_3FeN$ film on a magnetic device. The technique to perform such a process are well known to industry and is used at Michigan State University to produce magnetic devices in general.

1): Photolithography

As shown in FIGS. 15A-15D, the first step of making nano-size magnetic multilayer device is to deposit the electrical leads (Ti—Au) using a photolithography technique.

The substrates 10 are preferably 2"—$Al_2O_3$ (11-20) wafers. To produce a pattern for the Au electrical leads, a few drops of S1805 or 1813 (propylene glycol monomethyl ether acetate) photo-resist (PR) 20 is placed on the wafer and spin at 4000-5000 rpm for 40-60 seconds to create a uniform PR thickness of ~500 nm. The wafer is baked at 95° C. for 45 minute. By using a shadow photo mask, the sample is exposed to a UV ray for 4 sec. Then dipping the exposed wafer in chlorobenzene for 20 seconds hardens the surface of the PR. The sample is then developed in photo-developer for about 45 second until the entire exposed area of PR 30 is dissolved.

2): Evaporation of Electrical Contacts 40

Figure 16:
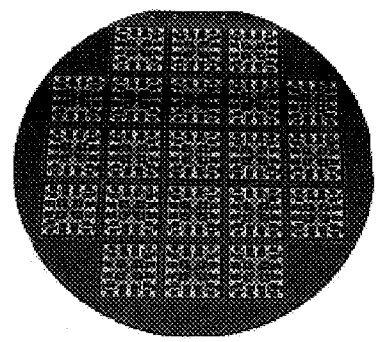
FIG. 16 is an illustration of a typical Au electrical lead evaporated and covered with e-beam resists bilayer.
Figure 15C:
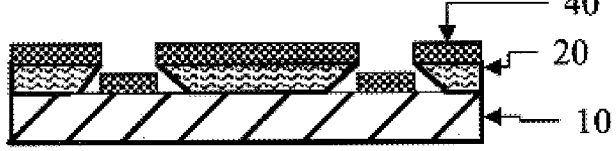
Figure 15D:
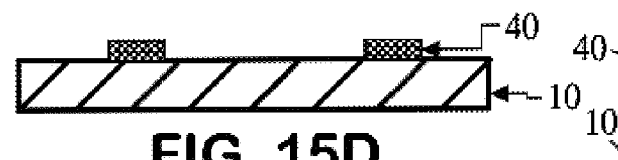
Figure 17:
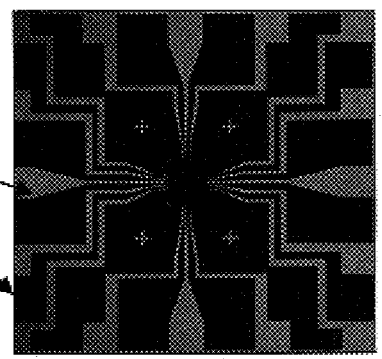
FIG. 17 is an illustration of a single substrate 1.27 cm×1.27 cm.

First, a 3 nm thick Ti film 40 is evaporated onto the desired wafer for providing strong adhesion of gold layer to the substrate, and then optional 70-80 nm thick layer of Cu 40 is evaporated to decrease the resistance of the electrical leads. And then 100 nm thick Au layer 40 is deposited. The material evaporated on the top of the PR is lift-off in acetone and rinsed the wafer with isopropyl alcohol (IPA) and then is dried with nitrogen gas. A typical final product of photolithography process is shown in FIG. 16. In FIG. 17 a single substrate (1.27 cm×1.27 cm) cut from the wafer is shown. The crosses are the alignment marks, which are used to align the sample in a Scanning Electron Microscope (SEM) for the e-beam lithography process.

3): E-Beam Lithography (EBL) Process

As shown in the FIGS. 18A to 18D, in a typical EBL process, for fabrication polycrystalline thin film in the magnetic devices, a few drop of 9% MMA (9% in ethyl lactate) e-beam resist (positive resist) 50 is spun on the wafer at 4000 rpm for 30 seconds and is baked for 5 minutes at 170° C. A second layer of 2% or 4% PMMA (2% in chlorobenzene) e-beam resist 60 is spun on top of MMA layer at 4000 rpm for 30 seconds and is baked for 30 minutes at 170° C. The desired patterns are drawn by exposing the sample to an e-beam JEOL 840A SEM (with W-hairpin electron source). In this process, the e-beam resist reacts with the electron beam in the scanned area and becomes soluble in the e-beam developer. After developing the sample in the e-beam developer (1:3 mixture of 4 methyl-2-pentanone and isopropylalcohol (IPA) the less exposed part doesn't dissolve completely. This gives a good undercut for lift-off FIG. 18B. Because PMMA and MMA cannot be exposed to the heat higher that 170° C. (lift-off problem), it is not the proper e-beam resist to be used for epitaxial sputtered films, as discussed above. However, there are high temperature e-beam resists such as PES (the poly PhenyleneEther-Sulfone), which are substitutes. The detail of EBL process using such high temperature e-beam resists is given in the reference (P. Dubos et al., J. Vac. Sci. Techn. B 18, 122 (2000).

4) Sputtering (Deposition of the Multilayer)

Figure 18A:
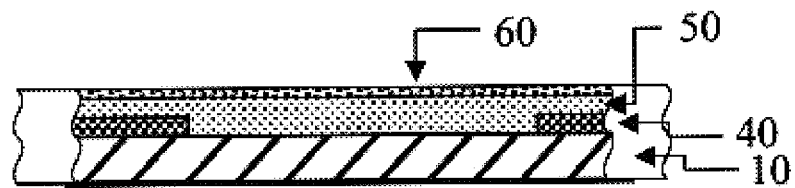
FIG. 18 is cross-sectional views of process for depositing a magnetic multilayer.
Figure 18B:
Figure 18C:
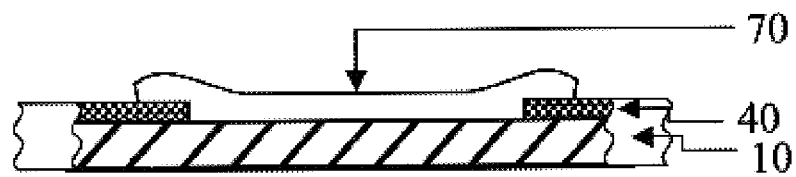
Figure 19:
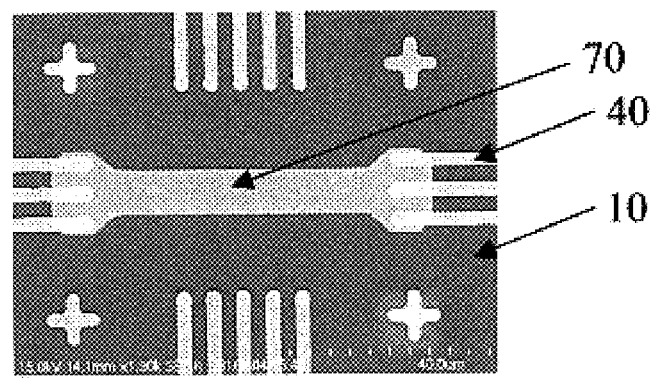
FIG. 19 is an SEM picture of the multilayer.

The magnetic multilayers 70 shown in the FIG. 18C could have the structure of F/N/F, S/N/F/N/F/N/S, or S/F/N/F/S layers, where the F, N, and S stand for ferromagnetic (NiFe, NiFeN, Fe, FeN, Co, . . . ), nonmagnetic (Cu, Ag, Pt, Pd . . . ), and superconductor (Nb, NbN, NbTi, . . . ) materials, respectively. The nonmagnetic layer could also be an insulator (Tunneling Barrier) such as AlN or an oxide layer (NiFeN/AlN/NiFe, FeN/AlN/NiFe, or $AlO_x$) for magnetic tunneling junction (MTJ) used in MRAM technology. The whole multilayer is covered with a layer of Au to minimize surface oxidation. After the deposition, samples are immerged into warm acetone to lift-off the e-beam resist and followed by rinsing them in IPA and deionized (DI) water. The final product 70 at this stage is shown in the FIG. 19.

5): Shaping the Nano-Size Devices (Nano-Pillars)

Figure 20:
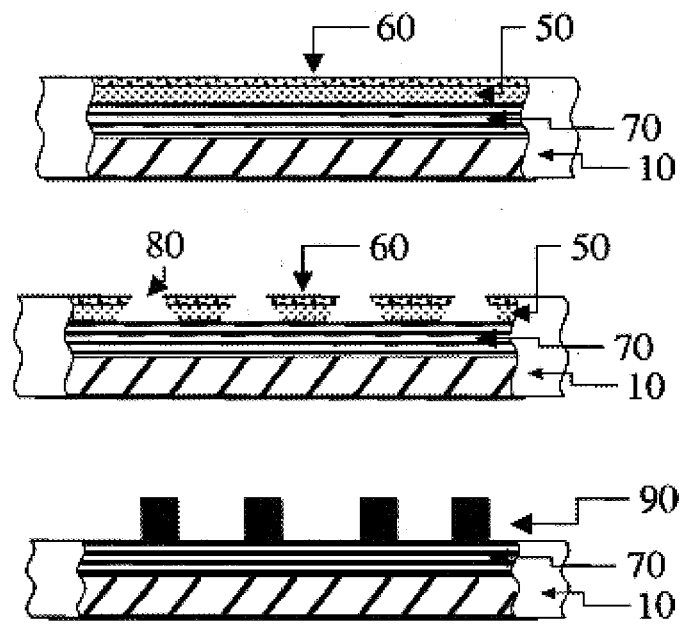
FIG. 20 is cross-sectional views of process for making the nano-size magnetic devise.
Figure 21:
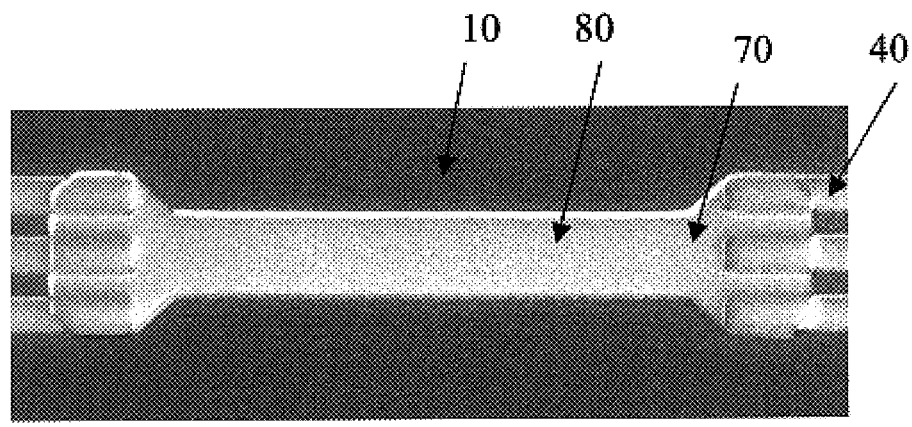
FIG. 21 is an optical microscope image of the openings for pillars. The details of the ellipses are not clear because the dimensions are below optical resolution.

To make the nano-size pillars 90, as shown in the FIGS. 20A to 20C, a few drops of 9% MMA 70 is spun on the sample at 6000 rpm for 30 seconds and is baked for 5 minutes at 170° C. A second layer of e-beam resist 60 is made by spinning 2% PMMA at 6000 rpm for 30 seconds and is baked for 30 minutes at 170° C. Sample is then loaded into the SEM to write the elliptical nano-pillar shapes. The dimensions of the nano-pillars are 70×130 nm ellipses. This process ends with developing the pillars 80. FIG. 21 shows a picture of the developed pillars.

At this stage, the samples are loaded into the evaporator and a 60 nm thick of Al film is deposited as ion-mill masks and then lift-off the e-beam resist 90.

6) Ion Milling and SiO Evaporation

To protect the Au contacts and select the area where the insulating SiO layer is deposited, 2 new layer of e-beam resist are spun to create an open rectangle in the center of substrate. The procedure is similar to the part 3.

Figure 22:
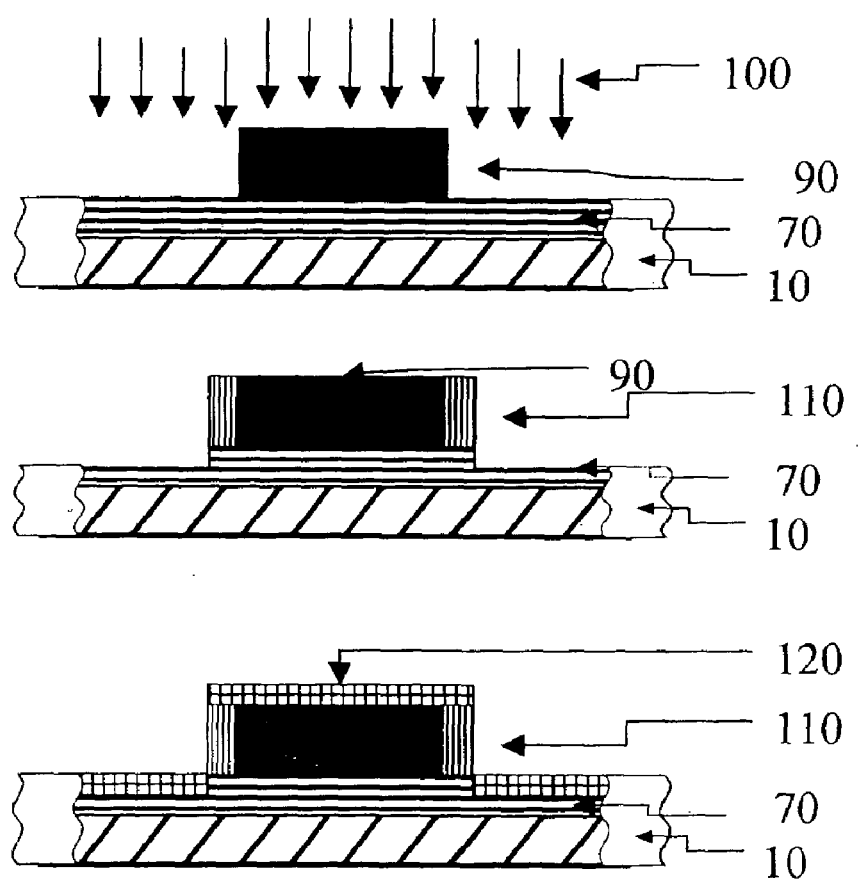
FIG. 22 is cross-sectional views of process for ion milling of the nano-size pillars and SiO deposition.

In the Ion mill etching process, a broad 3-cm Ar ion beam 100 in a vacuum chamber is used as shown in FIG. 22. After ion milling, without breaking the vacuum, a 50 nm thick layer of SiO 120 (or could be $SiO_2$) is evaporated to insulate part of fabricated feature from the top Au strip.

Figure 23:
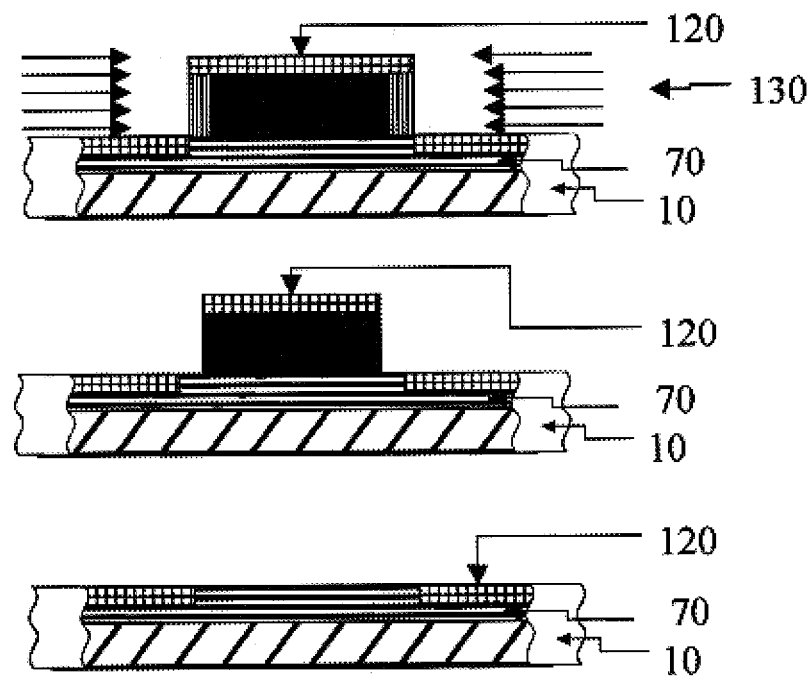
FIG. 23 is cross-sectional views of process for side ion milling and removal of Al layer.
Figure 24:
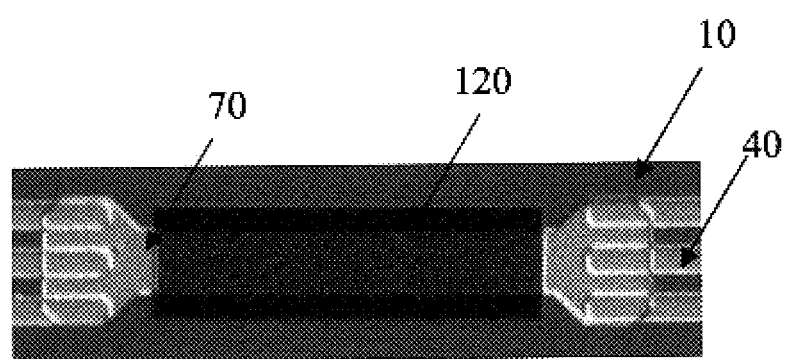
FIG. 24 is an optical microscope image of insulating SiO layer.
Figure 25:
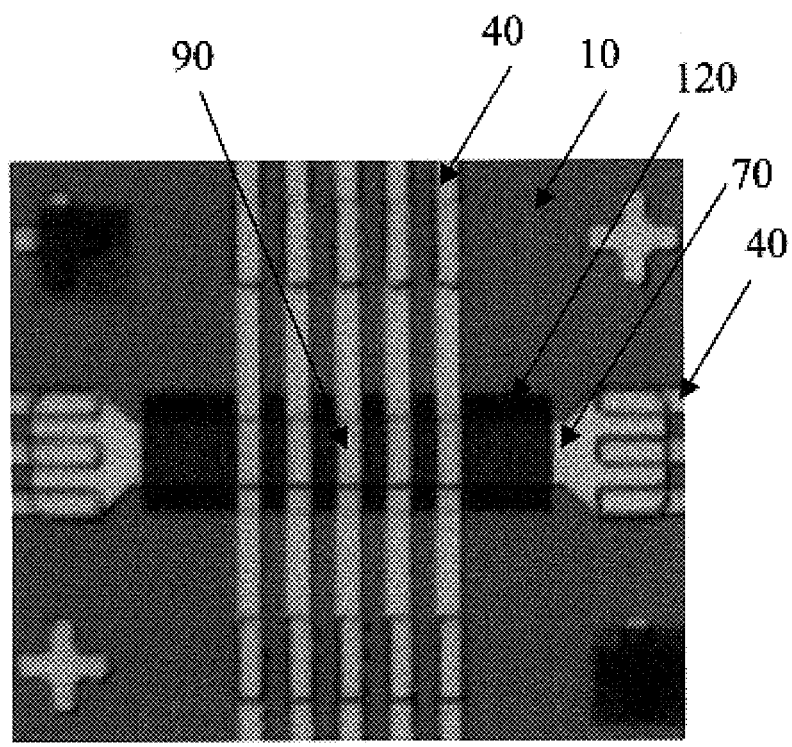
FIG. 25 is an optical microscope image of the final product.

Since SiO is evaporated over the whole pillar region, the top contact is covered with SiO as shown in FIG. 23. At this stage the sample must be ion mill etched 130 from the sides to remove the particle wall 110 (coming from backscattered material during ion milling) to open up the Au for top contact. To do this, a special sample holder which has a nearly vertical (tilted 3° with the vertical) slot for the sample is used. The SiO is then lift-off in a hot acetone (at 80° C.) bath to speed up the lift-off. FIG. 25 shows a picture after SiO is lifted off.

After the ion milling from sides, there is still some Al left over which can be etched in KOH.

7): Top Contacts

Finally, in the last step for depositing top contacts, 2 new layer of e-beam resist (the same e-beam resist bilayer as in step (6) are deposited. And the top contact features are written. After deposition of the top Au layer (100 nm thick) and developing the sample in the e-beam developer, the final nano-size pillar or device is ready for measurements. FIG. 25 shows a picture final product.

EXAMPLE 2

The epitaxial PyN can also be grown on the Si substrate (most common used substrate in industry), providing a convenient nucleation sits for the epitaxial growth with or without use of a buffer layer. As an example, 100 nm thick film of epitaxial PyN was deposited on two separate substrates of (1) $Al_2O_3$ (1120), and (2) Si(100) which were sitting in a same substrate holder side by side. The Si substrate was treated in a dilute hydrofluoric solution for about 3 minutes to remove the native oxide layer.

Figure 26:
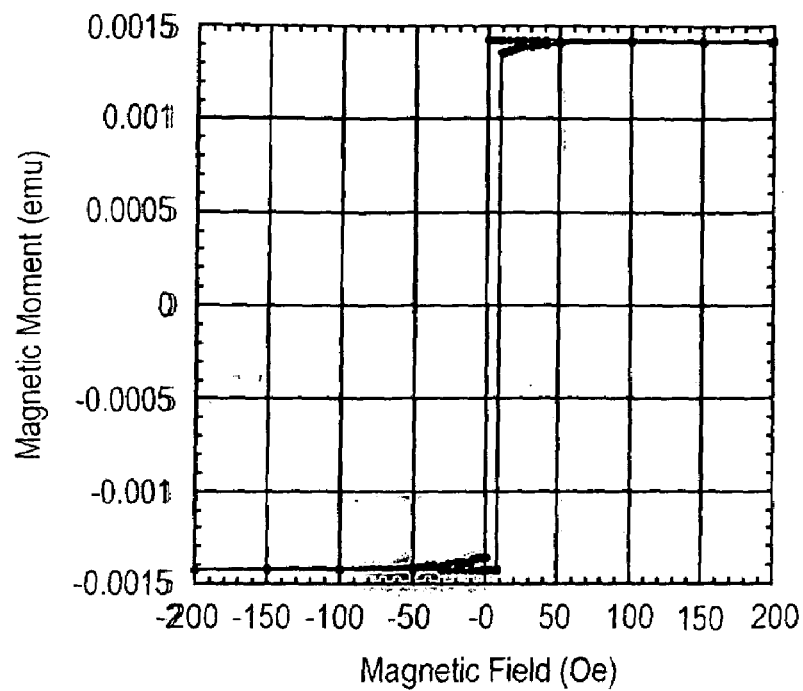
FIGS. 26 and 27 are graphs showing (FIG. 26) epitaxial PyN on $Al_2O_3$ (1120) and (FIG. 27) epitaxial PyN (100) on Si(100).
Figure 27:
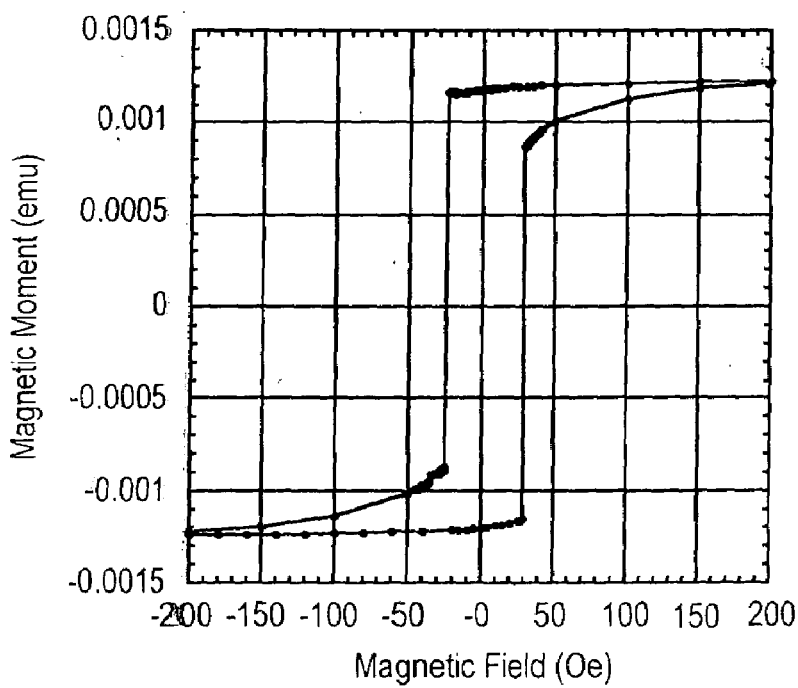

Referring to FIGS. 26 and 27, the magnetization hysteresis loops of PyN (100) on the $Al_2O_3$ (1120) and Si(100) substrates are shown, respectively. The magnetization in the epitaxial PyN deposited on Si seems to have uniform magnetic domain, which rotates coherently in response to the switching field with sharp transition. However, compared to the epitaxial PyN deposited on $Al_2O_3$ (1120), the coercivity is higher and also after rotation, it needs higher field for stabilization of the domain wall.

Figure 28:
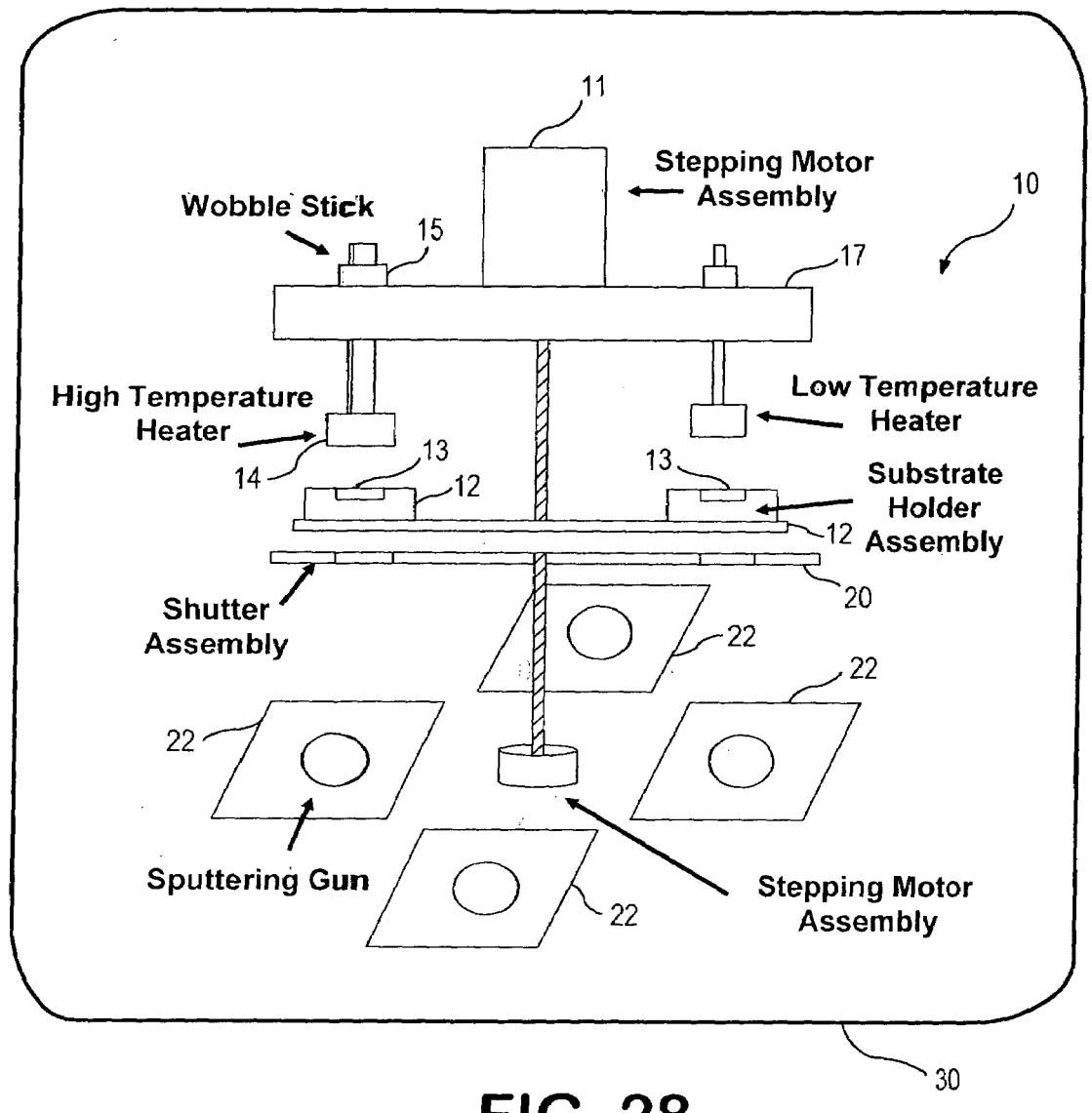
FIG. 28 is a schematic perspective view of a preferred apparatus for depositing epitaxial PyN.

FIG. 28 schematically shows a preferred apparatus 10 for depositing the epitaxial PyN. A first stepping motor 11 moves carousel 12 with substrate holder assemblies 13 surrounding the substrates. A high temperature heater 14 is used to condition the substrate and a wobble stick 15 moves sideways to insure uniform heating. A low temperature heater 16 is used for depositing the epitaxial PyN. The low temperature heater 16 and the high temperature heater are mounted on support 17. A shutter assembly 20 on second stepping motor 21 is used for volatilizing and then selectively depositing the epitaxial PyN onto the substrate through openings (not shown) in the carousel 12. Sputtering guns 22 are used to volatilize the target onto the epitaxial substrate below the low temperature heater 16. The apparatus 10 is confined in a vacuum system.

It is intended that the foregoing description be only illustrative of the present invention and that the present invention be limited only by the hereinafter appended claims.

I claim:

1. A process for the preparation of epitaxial $Ni_3FeN$ layer, which comprises:
    (a) providing an epitaxial substrate which serves as a nucleation site for epitaxial growth of the $Ni_3FeN$ layer in a reaction chamber;
    (b) optionally providing an epitaxial buffer layer which serves as a nucleation site for epitaxial growth of the $Ni_3FeN$ layer in a reaction chamber; and
    c) sputter depositing the $Ni_3FeN$ layer onto the substrate or the buffer layer from a source of $Ni_{81}Fe_{19}$ in a nitrogen atmosphere in a chamber at a reduced pressure and an elevated temperature to produce the epitaxial $Ni_3FeN$ wherein epitaxial $Ni_3FeN$ layer exhibits magnetic anisotropy, a single magnetic domain, and an essentially square transition movement upon switching of an external applied magnetic field direction providing a hysteresis loop.

2. The process of claim 1 wherein the substrate for the depositing is $Al_2O_3$ (1120).

3. The process of claims 1 or 2 wherein the substrate for depositing is Cu on Nb on $Al_2O_3$ (1120).

4. The process of claims 1 or 2 wherein the sputtering takes place at a nitrogen partial pressure between 30-40% of total Argon pressure and at a temperature of about 400° C. or higher.

* * * * *

UNITED STATES PATENT AND TRADEMARK OFFICE
CERTIFICATE OF CORRECTION

PATENT NO.        : 7,354,505 B2
APPLICATION NO.   : 10/925815
DATED             : April 8, 2008
INVENTOR(S)       : Reza Loloee It is certified that error appears in the above-identified patent and that said Letters Patent is hereby corrected as shown below:

Column 2, line 36, "(1120)" should be -- (11$\bar{2}$0) --.

Column 2, line 38, "(1120)" should be -- (11$\bar{2}$0) --.

Column 2, line 41, "(1120)" should be -- (11$\bar{2}$0) --.

Column 2, lines 54 & 55, "(1120)" should be -- (11$\bar{2}$0) --.

Column 3, line 24, "(1120)" should be -- (11$\bar{2}$0) --.

Column 3, line 28, "(1120)" should be -- (11$\bar{2}$0) --.

Column 3, line 33, "(1120)" should be -- (11$\bar{2}$0) --.

Column 3, line 36, "(1120)" should be -- (11$\bar{2}$0) --.

Column 3, line 41, "(1120)" should be -- (11$\bar{2}$0) --.

Column 3, line 54, "(1120)" should be -- (11$\bar{2}$0) --.

Column 3, line 59, "(1120)" should be -- (11$\bar{2}$0) --.

Column 4, line 18, "(1120)" should be -- (11$\bar{2}$0) --.

Column 4, line 53, "(1120)" should be -- (11$\bar{2}$0) --.

Column 4, line 54, "Mgo(111)" should be -- MgO(111) --.

Column 5, line 5, "10$^-$3" should be -- $10^{-3}$ --.

Column 5, line 26, "(1120)" should be -- (11$\bar{2}$0) --.

Column 5, line 37, "(1120)" should be -- (11$\bar{2}$0) --.

Column 5, line 42, "(1120)" should be -- (11$\bar{2}$0) --.

Column 5, line 45, "(1120)" should be -- (11$\bar{2}$0) --.

UNITED STATES PATENT AND TRADEMARK OFFICE
CERTIFICATE OF CORRECTION

PATENT NO.      : 7,354,505 B2
APPLICATION NO. : 10/925815
DATED           : April 8, 2008
INVENTOR(S)     : Reza Loloee It is certified that error appears in the above-identified patent and that said Letters Patent is hereby corrected as shown below:

Column 5, line 51, "(1120)$Al_2O_3$ with [100]PyN || [1100]" should be -- (11$\bar{2}$0)$Al_2O_3$ with [100] PyN || [1$\bar{1}$00] --.

Column 5, line 54, "(1120)" should be -- (11$\bar{2}$0) --.

Column 6, line 6, Table 1, "(1120)" should be -- (11$\bar{2}$0) --.

Column 6, line 17, "(1120)" should be -- (11$\bar{2}$0) --.

Column 6, line 33, "(1120)" should be -- (11$\bar{2}$0) --.

Column 6, line 63, "(1120)" should be -- (11$\bar{2}$0) --.

Column 6, line 64, "(1120)" should be -- (11$\bar{2}$0) --.

Column 7, line 1, "(1120)" should be -- (11$\bar{2}$0) --.

Column 7, line 5, "(1120)" should be -- (11$\bar{2}$0) --.

Column 7, line 24, "(1120)" should be -- (11$\bar{2}$0) --.

Column 7, line 27, "(1120)" should be -- (11$\bar{2}$0) --.

Column 7, line 35, "(1120)" should be -- (11$\bar{2}$0) --.

Column 7, line 38, "(1120)" should be -- (11$\bar{2}$0) --.

Column 7, line 47, "(1120)" should be -- (11$\bar{2}$0) --.

Column 8, line 13, "(1120)" should be -- (11$\bar{2}$0) --.

Column 8, line 16, "(1120)" should be -- (11$\bar{2}$0) --.

Column 8, line 22, "(1120)$Al_2O_3$ with [100]PyN || [1100]" should be -- (11$\bar{2}$0)$Al_2O_3$ with [100] PyN || [1$\bar{1}$00] --.

UNITED STATES PATENT AND TRADEMARK OFFICE
CERTIFICATE OF CORRECTION

PATENT NO. : 7,354,505 B2
APPLICATION NO. : 10/925815
DATED : April 8, 2008
INVENTOR(S) : Reza Loloee It is certified that error appears in the above-identified patent and that said Letters Patent is hereby corrected as shown below:

Column 8, line 57, "(1120)" should be -- ($11\bar{2}0$) --.

Column 9, line 11, "(1120)" should be -- ($11\bar{2}0$) --.

Column 9, line 13, "(1120)" should be -- ($11\bar{2}0$) --.

Column 9, line 18, "(1120)" should be -- ($11\bar{2}0$) --.

Column 11, line 45, "(1120)" should be -- ($11\bar{2}0$) --.

Column 11, line 50, "(1120)" should be -- ($11\bar{2}0$) --.

Column 12, line 3, "(1120)" should be -- ($11\bar{2}0$) --.

Column 12, line 44, Claim 7, "(1120)" should be -- ($11\bar{2}0$) --.

Column 12, line 46, Claim 8, "(1120)" should be -- ($11\bar{2}0$) --.

Signed and Sealed this

Thirtieth Day of December, 2008

JON W. DUDAS
*Director of the United States Patent and Trademark Office*